United States Patent
Kang et al.

(10) Patent No.: US 9,991,853 B2
(45) Date of Patent: Jun. 5, 2018

(54) DUAL OPERATION MODE POWER AMPLIFIER

(71) Applicant: FCI INC, Bundang-gu (KR)

(72) Inventors: Min-Chul Kang, Bundang-gu (KR); Myung-Woon Hwang, Bundang-gu (KR)

(73) Assignee: FCI INC, Bundang-gu (KR)

( * ) Notice: Subject to any disclaimer, the term of this patent is extended or adjusted under 35 U.S.C. 154(b) by 14 days.

(21) Appl. No.: 15/335,455

(22) Filed: Oct. 27, 2016

(65) Prior Publication Data

US 2017/0126185 A1 May 4, 2017

(30) Foreign Application Priority Data

Oct. 30, 2015 (KR) ................. 10-2015-0152660

(51) Int. Cl.
*H03F 3/45* (2006.01)
*H03F 1/56* (2006.01)
*H03F 3/21* (2006.01)
*H03F 3/191* (2006.01)

(52) U.S. Cl.
CPC .............. *H03F 1/565* (2013.01); *H03F 3/21* (2013.01); *H03F 3/45179* (2013.01); *H03F 1/56* (2013.01); *H03F 3/191* (2013.01); *H03F 3/45* (2013.01); *H03F 3/45071* (2013.01); *H03F 3/45085* (2013.01); *H03F 3/45183* (2013.01); *H03F 2200/222* (2013.01); *H03F 2200/294* (2013.01); *H03F 2200/387* (2013.01); *H03F 2203/45022* (2013.01); *H03F 2203/45596* (2013.01); *H03F 2203/45621* (2013.01); *H03F 2203/45731* (2013.01)

(58) Field of Classification Search
CPC ........ H03F 1/565; H03F 3/21; H03F 3/45179; H03F 2200/222; H03F 2200/387; H03F 2203/45022; H03F 1/56; H03F 3/45; H03F 3/191; H03F 2200/318; H03F 3/45071
USPC .................................................. 330/261, 302
See application file for complete search history.

(56) References Cited

U.S. PATENT DOCUMENTS

| | | | |
|---|---|---|---|
| 7,362,174 B2 * | 4/2008 | Cao ................... | H03F 3/195 330/253 |
| 7,890,069 B2 | 2/2011 | Kyranas et al. | |
| 8,508,299 B2 | 8/2013 | Kawano | |
| 8,525,590 B2 * | 9/2013 | Joly ................... | H03F 1/0211 330/285 |
| 8,872,588 B2 * | 10/2014 | Li ..................... | H03F 1/0261 330/261 |
| 9,306,514 B2 * | 4/2016 | Kwon ................. | H03F 1/565 |

(Continued)

*Primary Examiner* — Khanh V Nguyen
(74) *Attorney, Agent, or Firm* — Mark M. Friedman

(57) ABSTRACT

A dual operation mode power amplifier is disclosed. In the power amplifier in accordance with an embodiment of the present invention, a bias circuit part can be converted to decrease power consumption. Different from the prior art, performance of the present invention is not reduced in a high power mode, and no additional passive components like inductors or transformers with a large area are necessary to be further added. Furthermore, a tunable impedance matching circuit provides impedances respectively matching impedances of a fully differential amplifier and a single-ended amplifier, thereby improving the performance of the power amplifier.

18 Claims, 6 Drawing Sheets

(56) References Cited

U.S. PATENT DOCUMENTS

2009/0191838 A1\* 7/2009 Chang .................... H04B 1/18
455/341
2011/0018632 A1 1/2011 Pletcher et al.
2013/0069725 A1\* 3/2013 Kondo ................ H03F 1/0272
330/276
2014/0266500 A1 9/2014 Papamichail et al.

\* cited by examiner

DUAL OPERATION MODE POWER AMPLIFIER

BACKGROUND

Field

Embodiments of the present invention relate to a power amplifier, which is operated as a fully differential amplifier having two differential inputs and two differential outputs in a high power mode. In contrast, in a low power mode, the power amplifier is operated as a single-ended amplifier by selecting only one of the two differential inputs and only one of the two differential outputs with a bias circuit part.

Background

The statements in this section merely provide background information related to the present invention and may not constitute the prior art.

The same as a power amplifier used in a base station, a power amplifier used in a wireless communication device, such as a cellular handset or a WIFI network, should provide proper output power according to a communication standard of a system and an objective of the system. Currently, various technologies for minimizing a current loss are developed when an output power (in a low power mode) is lower than a maximum output power of the power amplifier in the system.

The prior art includes a stage bypass method, an additional path method in a low power mode, and so on. However, in the above-mentioned, methods, performance of the maximum output power (i.e., a high power mode) is decreased, or additional components (inductors or transformers) are required. That is, the above-mentioned methods are not ideal. Consequently, there is a need to develop a power amplifier capable of decreasing the current loss and saving cost in a low power mode.

SUMMARY OF THE DISCLOSURE

An objective of the present embodiment is that when a power amplifier is operated in a low power mode, circuits of the power amplifier are operated from a fully differential amplifier to a single-ended amplifier, so as to reduce a current loss. For the above-mentioned operation, bias circuit parts in plural stage are necessary to selectively switch two inputs and two outputs of the fully differential amplifier. Gain and linear relationship of a whole system are determined according to isolation performance of input terminals and output terminals of all matching circuits and impedance matching degree. Accordingly, a tunable impedance matching circuit is provided when the power amplifier is operated in the low power mode.

According to a feature of an embodiment of the present invention, a power amplifier is selectively operated in one of a high power mode and a low power mode and comprises: a main power amplifier having two differential inputs and two differential outputs; an input matching circuit receiving an input signal from at least one input signal terminal and connected to at least one input terminal of the main power amplifier, so that an impedance of the at least one input signal terminal matches an impedance of the at least one input terminal of the main power amplifier; an output matching circuit connected between at least one output terminal of the main power amplifier and a load, so that an impedance of the load matches an impedance of the at least one output terminal of the main power amplifier; and a bias circuit part, according to a control signal, generating a conversion signal for driving the main power amplifier to be switched to a fully differential amplifier or a single-ended amplifier.

In a preferred embodiment of the power amplifier, the main power amplifier is operated as the fully differential amplifier in the high power mode, and the main power amplifier is operated as the single-ended amplifier in the low power mode.

In a preferred embodiment of the power amplifier, when the main power amplifier is operated in the low power mode, the bias circuit part selectively operates only one of the two differential inputs and only one of the two differential outputs.

In a preferred embodiment of the power amplifier, in the low power mode, the bias circuit part selectively provides a bias source for only one of the two differential inputs.

In a preferred embodiment of the power amplifier, the main power amplifier comprises two pairs of cascode structure parts. Each pair of the cascode structure parts comprises a main transistor and a stacked transistor. A current input terminal of the main transistor is connected to a current output terminal of the stacked transistor. The two differential inputs are respectively connected to control terminals of the main transistors of the two pairs of cascode structure parts. In the low power mode, the bias circuit part selectively provides a bias source for only one of the two differential inputs.

In a preferred embodiment of the power amplifier, when the main power amplifier is operated as the single-ended amplifier in the low power mode, an impedance of at least one of the input matching circuit and the output matching circuit is tunable.

In a preferred embodiment of the power amplifier, at least one of the input matching circuit and the output matching circuit comprises: a transformer having a turns ratio tap; and two capacitors respectively connected in parallel with a primary coil and a secondary of the transformer. An impedance of the transformer is adjusted by tuning the turns ratio tap or changing capacitance values of the two capacitors.

In a preferred embodiment of the power amplifier, at least one of the input matching circuit and the output matching circuit comprises: a transformer; two capacitors connected in series and connected in parallel with a primary coil of the transformer; and a switch disposed between the two capacitors and connected to ground. An impedance of the transformer is adjusted by turning on or of the switch.

In a preferred embodiment of the power amplifier, at least one of the input matching circuit and the output matching circuit comprises: a transformer; and a switch disposed at a primary coil of the transformer and connected to ground. An impedance of the transformer is adjusted by turning on or off the switch.

In a preferred embodiment of the power amplifier, the main power amplifier comprises: a first power amplifier connected between the input matching circuit and an intermediate matching circuit for amplifying the input signal; the intermediate matching circuit connected between at least one output terminal of the first power amplifier and at least one input terminal of a second power amplifier, so that an impedance of the at least one output terminal of the first power amplifier matches an impedance of the at least one input terminal of the second power amplifier; and the second power amplifier connected between the intermediate matching circuit and the output matching circuit for amplifying an output signal from the first power amplifier.

In a preferred embodiment of the power amplifier, the first power amplifier and the second power amplifier are operated as the fully differential amplifier in the high power mode, and the first power amplifier and the second power amplifier are operated as the single-ended amplifier in the low power mode.

In a preferred embodiment of the power amplifier, each of the first power amplifier and the second power amplifier comprises two differential inputs and two differential outputs. In the low power mode, the bias circuit part selects only one of the two differential inputs and only one of the differential outputs.

In a preferred embodiment of the power amplifier, in the low power mode, the bias circuit part selectively provides a bias source for only one of the two differential inputs.

In a preferred embodiment of the power amplifier, each of the first power amplifier and the second power amplifier comprises two pairs of cascode structure parts. Each pair of the cascode structure parts comprises a main transistor and a stacked transistor. A current input terminal of the main transistor is connected to a current output terminal of the stacked transistor. The two differential inputs are respectively connected to control terminals of the main transistors of the two pairs of cascode structure parts. In the low power mode, the bias circuit part selectively provides a bias source for only one of the two differential inputs.

In a preferred embodiment of the power amplifier, when the main power amplifier is operated as the single-ended amplifier, an impedance of at least one of the input matching circuit and the output matching circuit is tunable.

In a preferred embodiment of the power amplifier, at least one of the input matching circuit and the output matching circuit comprises: a transformer having a turns ratio tap; and two capacitors respectively connected in parallel with a primary coil and a secondary of the transformer. An impedance of the transformer is adjusted by tuning the turns ratio tap or changing capacitance values of the two capacitors.

In a preferred embodiment of the power amplifier, at least one of the input matching circuit and the output matching circuit comprises: a transformer; two capacitors connected in series and connected in parallel with a primary coil of the transformer; and a switch disposed between the two capacitors and connected to ground. An impedance of the transformer is adjusted by turning on or off the switch.

In a preferred embodiment of the power amplifier, at least one of the input matching circuit and the output matching circuit comprises: a transformer; and a switch disposed at a primary coil of the transformer and connected to ground. An impedance of the transformer is adjusted by turning on or off the switch.

To make the objectives, features, and advantages of the present invention more clear and definite, the present invention will be described in details below by using embodiments in conjunction with the appending drawings.

DETAILED DESCRIPTION OF THE PREFERRED EMBODIMENTS

To make the objectives, features, and advantages of the present invention more clear and definite, the embodiments of the present invention will be described in details below in conjunction with the appending drawings.

Figure 1:
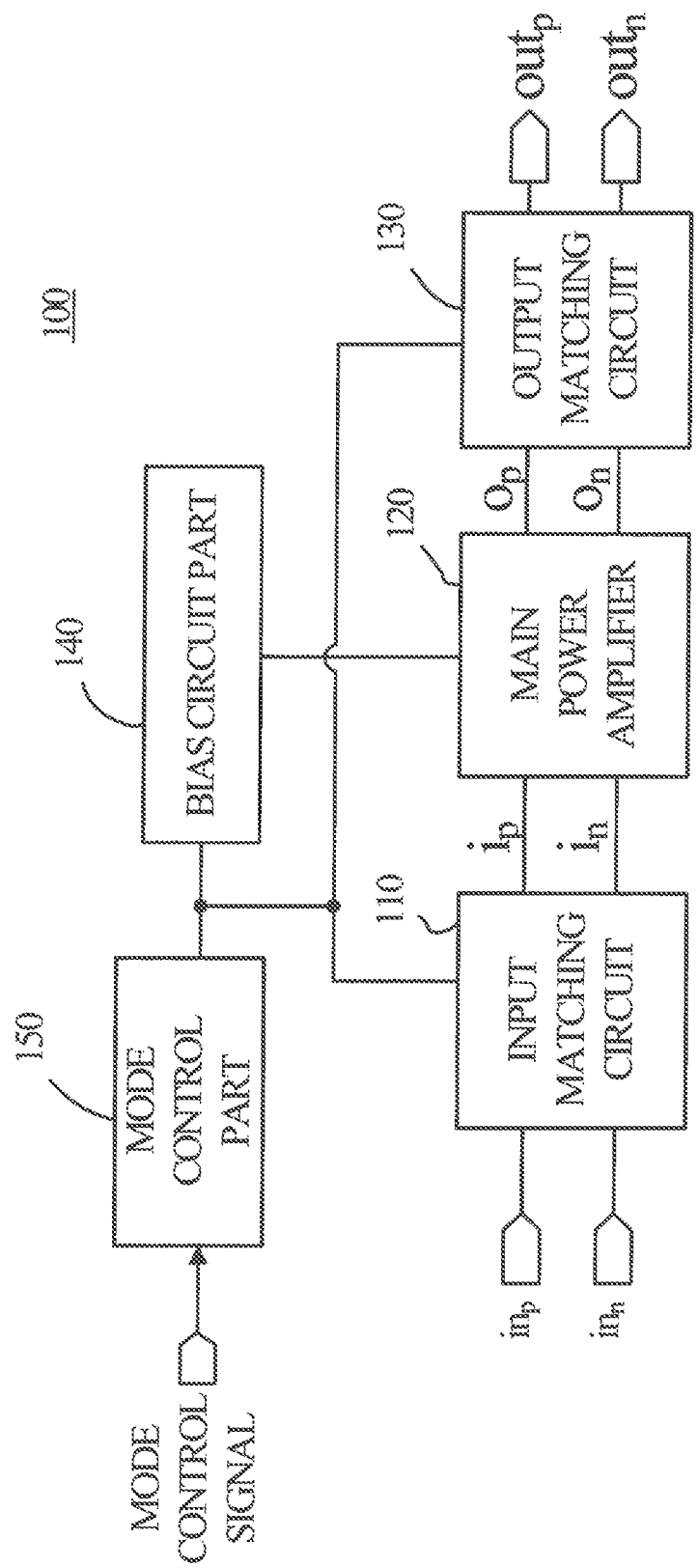
FIG. 1 shows modules included in a dual operation de power amplifier in accordance with an embodiment.

FIG. 1 shows modules included in a dual operation mode power amplifier in accordance with an embodiment. The power amplifier 100 in FIG. 1 includes an input matching circuit 110, a main power amplifier 120, an output matching circuit 130, a bias circuit part 140, and a mode control part 150.

The input matching circuit 110 is connected between input signal terminals $in_p$, $in_n$ and input terminals $i_p$, $i_n$ of the main power amplifier 120, so that an impedance of the input signal terminals $in_p$, $in_n$ matches an impedance of the input terminals $i_p$, $i_n$ of the main power amplifier 120. The input signal terminals $in_p$, $in_n$ are inputted by an input signal. The input matching circuit 110 is a tunable impedance structure, thereby being capable of tuning an impedance matching in a low power mode.

The main power amplifier 120 receives and amplifies a signal from the input terminals $i_p$, $i_n$. An output voltage amplified by the main power amplifier 120 passes output terminals $o_p$, $o_n$ and the output matching circuit 130 and then is provided for a load. In a high power mode, the main power amplifier 120 is operated as a fully differential amplifier having two differential inputs and two differential outputs. In the low power mode, the main power amplifier 120 is operated as a single-ended amplifier by selecting only one of the two differential inputs and only one of the two differential outputs with the bias circuit part 140.

The output matching circuit 130 is connected between the output terminals $o_p$, $o_n$ of the main power amplifier 120 and output signal terminals $out_p$, $out_n$, so that an impedance of the output terminals $o_p$, $o_n$ of the main power amplifier 120 matches an impedance of the load. The output matching circuit 130 is a tunable impedance structure, thereby being capable of tuning an impedance matching in the low power mode.

The bias circuit part 140 provides a bias source (a bias voltage or a bias current) for the main power amplifier 120. In order to drive the main power amplifier 120 to be operated as the fully differential amplifier in the high power mode, the bias circuit part 140 provides the bias source for the main power amplifier 120. However, in order drive the main power amplifier to be operated as the single-ended amplifier in the low power mode, the bias source is provided for only one of the two differential inputs and only one of the two differential outputs corresponding to the one of the two differential inputs. The bias source is not provided for the other one of the two differential inputs and the other one of the two differential outputs.

The mode control part 150 receives a mode control signal, generates a control signal, and transmits the control signal to the bias circuit part 140, the input matching circuit 110, and the output matching circuit 130.

The bias circuit part 140 drives the main power amplifier 120 to be switched to the fully differential amplifier or the single-ended amplifier according to the control signal which the mode control part 150 generates according to the mode control signal. When being operated in a multi-stage structure, the main power amplifier 120 can be utilized in a multi-stage amplifier. When stages of the multi-stage amplifier are more, effect of decreasing a current is more. However, an impedance of the multi-stage amplifier should match the impedance of the input matching circuit 110 and the impedance of the output matching circuit 130. In summary, if the power amplifier 100 is required to be operated in the low power mode to output a low power, the impedances of the input matching circuit 110 and the output matching circuit 130 have to be tuned to match an impedance of the single-ended amplifier. In order to drive the power amplifier to be operated in the low power mode, the mode control part 150 and the bias circuit part 140 control the multi-stage amplifier to be operated as the single-ended amplifier. The bias source is provided for only one of the two differential inputs and only one of the two differential outputs corresponding to the one of the two differential inputs. The bias source is not provided for the other one of the two differential inputs and the other one of the two differential outputs.

Figure 2:
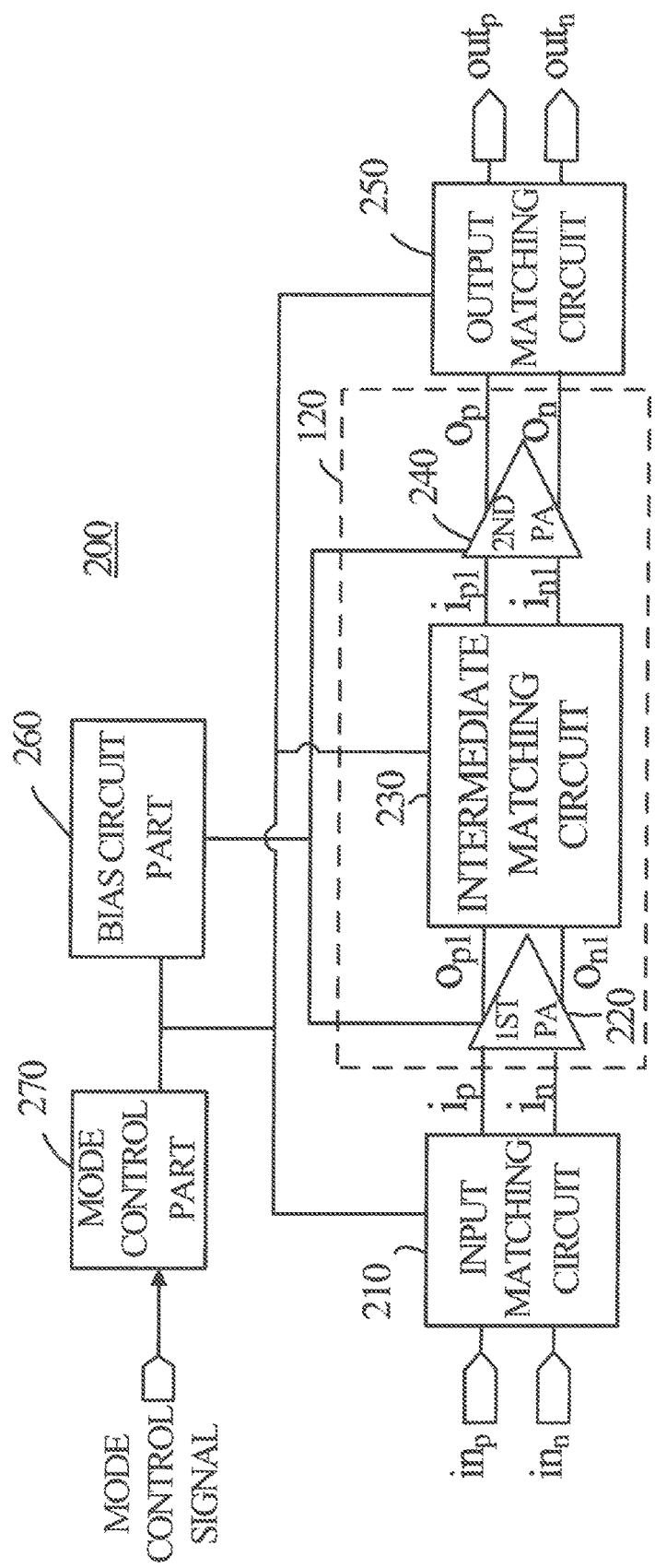
FIG. 2 shows modules included in a dual operation mode power amplifier in accordance with another embodiment.

FIG. 2 shows modules included in a dual operation mode power amplifier in accordance with another embodiment. The power amplifier 200 in FIG. 2 includes an input matching circuit 210, a first power amplifier 220, an intermediate matching circuit 230, a second power amplifier 240, an output matching circuit 250, a bias circuit part 260, and a mode control part 270. FIG. 2 is an embodiment of a dual operation mode circuit suitable to be utilized in a multi-stage power amplifier.

The input matching circuit 210 is connected between input signal terminals $in_p$, $in_n$ and input terminals $i_p$, $i_n$ of the first power amplifier 220, so that an impedance of the input signal terminals $in_p$, $in_n$ matches an impedance of the input terminals $i_p$, $i_n$ of the first power amplifier 220. The input signal terminals $in_p$, $in_n$ are inputted by an input signal. The input matching circuit 210 is a tunable impedance structure, thereby being capable of tuning an impedance matching in a low power mode.

The first power amplifier 220 receives and amplifies a signal from the input terminals $i_p$, $i_n$. An output voltage amplified by the first power amplifier 220 passes output terminals $o_{p1}$, $o_{n1}$ and the intermediate matching circuit 230 and then is provided for input terminals $i_{p1}$, $i_{n1}$ of the second power amplifier 240. In a high power mode, the first power amplifier 220 is operated as a fully differential amplifier having two differential inputs and two differential outputs. In the low power mode, the first power amplifier 220 is operated as a single-ended amplifier by selecting only one of the two differential inputs and only one of the two differential outputs with the bias circuit part 260.

The intermediate matching circuit 230 is connected between the output terminals $o_{p1}$, $o_{n1}$ of the first power amplifier 220 and the input terminals $i_{p1}$, $i_{n1}$ of the second power amplifier 240, so that an impedance of the output terminals $o_{p1}$, $o_{n1}$ of the first power amplifier 220 matches an impedance of the input terminals $i_{p1}$, $i_{n1}$ of the second power amplifier 240. The intermediate matching circuit 230 is a tunable impedance structure, thereby being capable of tuning an impedance matching in the low power mode.

The second power amplifier 240 receives and amplifies a voltage outputted by the output terminals $o_{p1}$, $o_{n1}$ of the first power amplifier 220. A voltage amplified by the second power amplifier 240 passes output terminals $o_p$, $o_n$ and the output matching circuit 250 and then is provided for a load. In a high power mode, the second power amplifier 120 is operated as a fully differential amplifier having two differential inputs and two differential outputs. In the low power mode, the second power amplifier 240 is operated as a single-ended amplifier by selecting only one of the two differential inputs and only one of the two differential outputs with the bias circuit part 260.

The output matching circuit 250 is connected between the output terminals $o_p$, $o_n$ of the second power amplifier 240 and output signal terminals $out_p$, $out_n$, so that an impedance of the output terminals $o_p$, $o_n$ of the second power amplifier 240 matches an impedance of the load. The output matching circuit 250 is a tunable impedance structure, thereby being capable of tuning an impedance matching in the low power mode.

The bias circuit part 260 provides a bias source for the first power amplifier 220 and the second power amplifier 240. In order to drive each of the first power amplifier 220 and the second power amplifier 240 to be operated as the fully differential amplifier in the high power mode, the bias circuit part 140 provides the bias source for the first power amplifier 220 and the second power amplifier 240. However, in order to drive each of the first power amplifier 220 and the second power amplifier 240 to be operated as the single-ended amplifier in the low power mode, the bias source is provided for only one of the two differential inputs and only one of the two differential outputs corresponding to the one of the two differential inputs in each of the first power amplifier 220 and the second power amplifier 240. The bias source is not provided for the other one of the two differential inputs and the other one of the two differential outputs in each of the first power amplifier 220 and the second power amplifier 240.

The mode control part 270 receives a mode control signal, generates a control signal, and transmits the control signal to the bias circuit part 260, the input matching circuit 210, the intermediate matching circuit 230, and the output matching circuit 250. The bias circuit part 260 selectively provides the bias source for each of the first power amplifier 220 and the second power amplifier 240 according to the control signal which the mode control part 270 generates according to the mode control signal.

Figure 3:
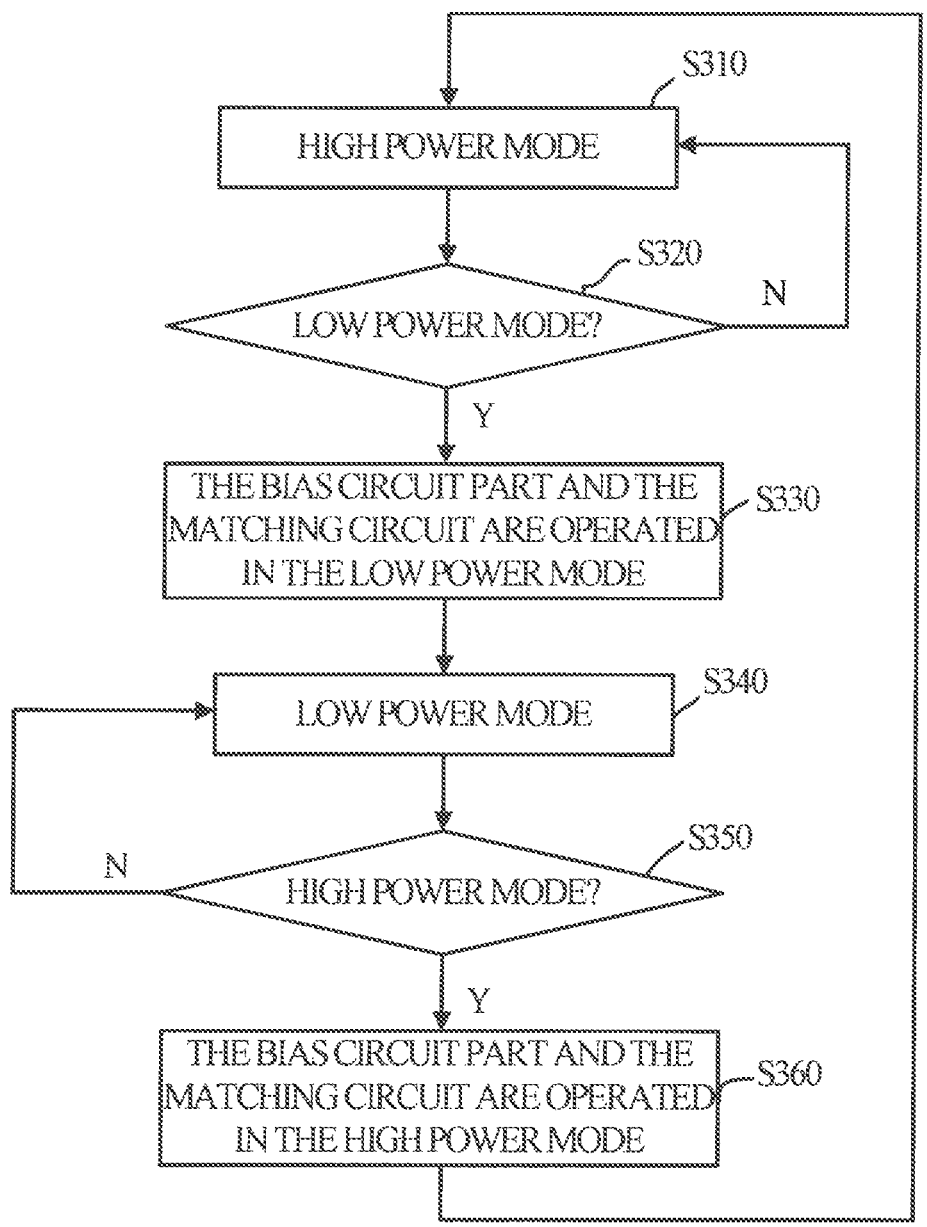
FIG. 3 shows a flowchart of an operation method of the dual operation mode power amplifier in accordance with the embodiment of FIG. 1.

FIG. 3 shows a flowchart of an operation method of the dual operation mode power amplifier in accordance with the embodiment of FIG. 1. Basically, the power amplifier 100 in FIG. 1 is set to be in a high power mode (S310). The bias circuit part 140 determines whether to switch the power amplifier 100 to be operated in a low power mode according to whether the bias circuit part 140 receives the control signal from the mode control part 150 (S320). If the control signal is not received, the power amplifier 100 remains in the high power mode and is operated as the fully differential amplifier. If the control signal, which the mode control part 150 generates according to the mode control signal, is transmitted to the bias circuit part 140, the input matching circuit 110, and the output matching circuit 130, the power amplifier 100 is switched to the low power mode (S330). Accordingly, the power amplifier 100 is operated in the low power mode (S340). The bias circuit part 140 determines whether to switch the power amplifier 100 to be operated in the high power mode according to whether the bias circuit part 140 receives the control signal from the mode control part 150 (S350). If the control signal is not received, the power amplifier 100 remains in the low power mode and is operated as the single-ended amplifier. If the control signal, which the mode control part 150 generates according to the mode control signal, is transmitted to the bias circuit part 140, the input matching circuit 110, and the output matching circuit 130, the power amplifier 100 is switched to the high power mode (S310). The bias circuit part 140, the input matching circuit 110, and the output matching circuit 130 are switched to the high power mode (S360). Accordingly, the power amplifier 100 is operated as the fully differential amplifier again.

Figure 4A:
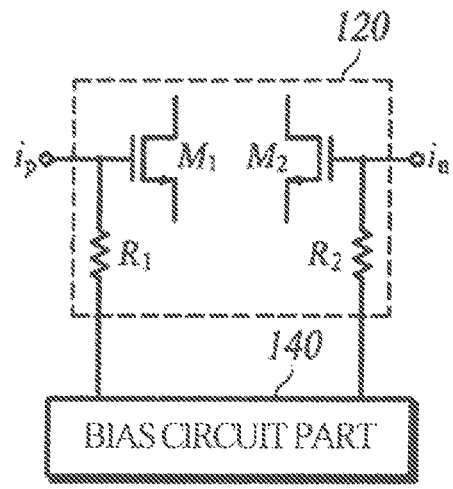
FIG. 4A shows a bias circuit of the power amplifier including N-type transistors and connected to input terminals in accordance with the embodiment of FIG. 1.

FIG. 4A shows a bias circuit of the power amplifier including N-type transistors and connected to the input terminals $i_p$, $i_n$ in accordance with the embodiment of FIG. 1. The N-type transistors may be N-type metal-oxide-semiconductor field-effect transistors (N-MOSFETs) or NPN bipolar junction transistors (NPN BJTs). Bases in the NPN BJTs or gates in the N-MOSFETs below are labeled as control terminals. Collectors in the NPN BJTs to which a current inputs or drains in the N-MOSFETS to which a current inputs are labeled as current input terminals. Emitters in the NPN BJTs from which the current outputs or sources in the N-MOSFETs from which the current outputs are labeled as current output terminals. If the transistors are PNP BJTs or P-MOSFETs, current input terminals and current output terminals are opposite to those of the NPN BJTs or MOSFETs.

Control terminals of M1 and M2 are connected to the two differential inputs. When the mode control part 150 receives the mode control signal to switch the main power amplifier 140 to the low power mode, the bias circuit part 140 switches to select one of R1 and R2 respectively connected to the control terminals of M1 and M2, so that the main power amplifier 120 is operated as the single-ended amplifier.

Figure 4B:
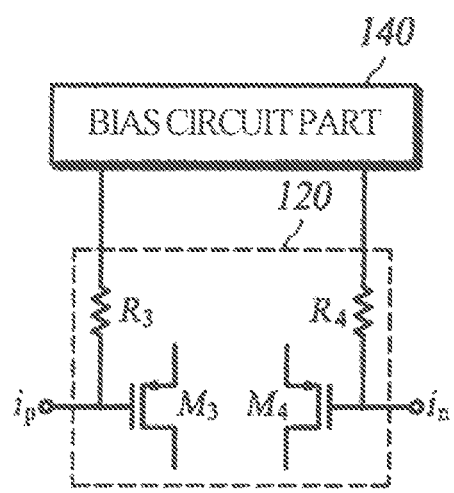
FIG. 4B shows a bias circuit of the power amplifier including P-type transistors and connected to the input terminals in accordance with the embodiment of FIG. 1.

FIG. 4B shows a bias circuit of the power amplifier including P-type transistors and connected to the input terminals $i_p$, $i_n$ in accordance with the embodiment of FIG. 1. The P-type transistors may be P-type metal-oxide-semiconductor field-effect transistors (P-MOSFETs) or PNP bipolar junction transistors (PNP BJTs). Control terminals of M3 and M4 are connected to the two differential inputs. When the mode control part 150 receives the mode control signal to switch the main power amplifier 140 to the low power mode, the bias circuit part 140 switches to select one of R3 and R4 respectively connected to the control terminals of M3 and M4, so that the main power amplifier 120 is operated as the single-ended amplifier.

Figure 5A:
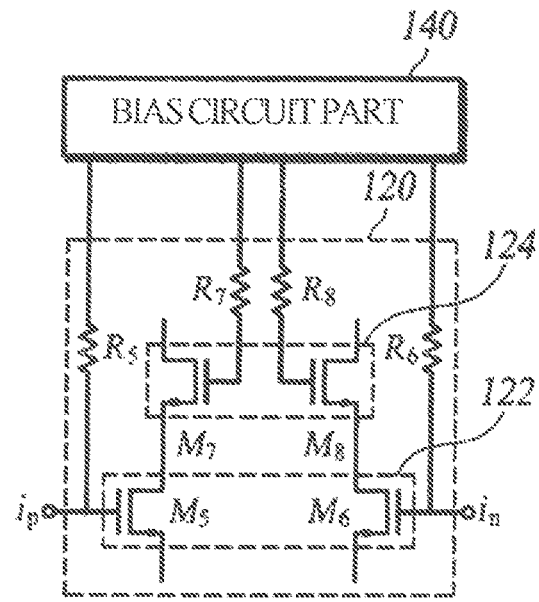
FIG. 5A shows a bias circuit of the power amplifier having an N-type transistor cascode structure and connected to the input terminals in accordance with the embodiment of FIG. 1.

FIG. 5A shows a bias circuit of the power amplifier having an N-type transistor cascode structure and connected to the input terminals $i_p$, $i_n$ in accordance with the embodiment of FIG. 1. In FIG. 5A, main transistors 122 include M5 and M6, and stacked transistors 124 include M7 and M8. Current input terminals of the main transistors 122 are connected to current output terminals of the stacked transistors 124 in a cascode structure. Control terminals of the main transistors 122 are respectively connected to the bias circuit part 140 via R5 and R6. Control terminals of the stacked transistors 124 are respectively connected to the bias circuit part 140 via R7 and R8. According to the control signal generated by the mode control part 150, the bias circuit part 140 selects one of the two differential inputs and one of the two differential outputs to switch the power amplifier 100 to be operated as the single-ended amplifier. The above-mentioned switching has advantages that no additional inductors which increase the size of the power amplifier 100 are necessary, and no switches which affect performance when the power amplifier 100 is operated in a maximum output are necessary.

Figure 5B:
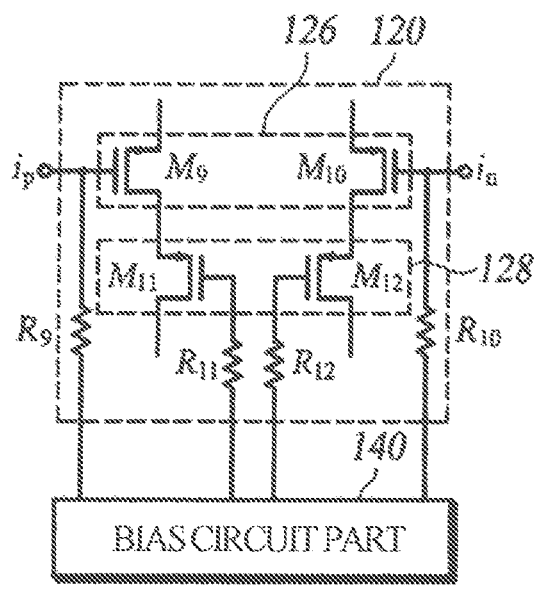
FIG. 5B shows a bias circuit of the power amplifier having a P-type transistor cascode structure and connected to the input terminals in accordance with the embodiment of FIG. 1.

FIG. 5B shows a bias circuit of the power amplifier having a P-type transistor cascode structure and connected to the input terminals $i_p$, $i_n$ in accordance with the embodiment of FIG. 1. In FIG. 5B, main transistors 126 include M9 and M10, and stacked transistors 128 include M11 and M12. Control terminals of the main transistors 126 are respectively connected to the bias circuit part 140 via R9 and R10. Control terminals of the stacked transistors 128 are respectively connected to the bias circuit part 140 via R11 and R12. The same as FIG. 5A, according to the control signal generated by the mode control part 150, the bias circuit part 140 selects one of the two differential inputs and one of the two differential outputs to switch the power amplifier 100 to be operated as the single-ended amplifier.

As mentioned above, an impedance matching in a situation that the main power amplifier 120 is operated as the single-ended amplifier which can decrease power consumption should be different from an impedance matching in a situation that the main power amplifier 120 is operated as the fully differential amplifier. This is because a matching circuit in the situation that the main power amplifier 120 is operated as the fully differential amplifier cannot be utilized a matching circuit in the situation that the main power amplifier 120 is operated as the single-ended amplifier. That is, when the power amplifier 120 is operated as the single-ended amplifier, loads in stages do not achieve the impedance matching. Accordingly, a matching circuit capable of tuning impedance is required.

Figure 6A:
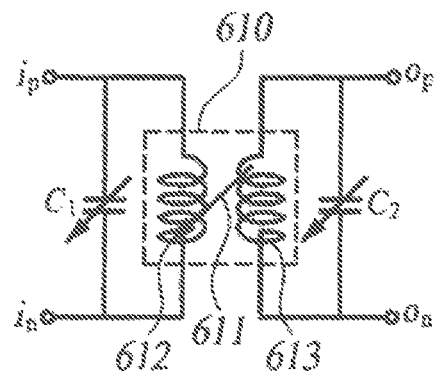
FIG. 6A shows a tunable impedance matching circuit in accordance with an embodiment.

FIG. 6A shows a tunable impedance matching circuit in accordance with an embodiment. FIG. 6A is a matching circuit capable of tuning an impedance and applicable to at least one of the input matching circuit 210, the intermediate matching circuit 230, and the output matching circuit 250. In FIG. 6A, a transformer 610 has a turns ratio tap 611. An impedance of input terminals $i_p$, $i_n$ and an impedance of output terminals $o_p$, $o_n$ of the matching circuit can match with each other by tuning the turns ratio tap 611 or changing a capacitance value of C1 or C2.

Figure 6B:
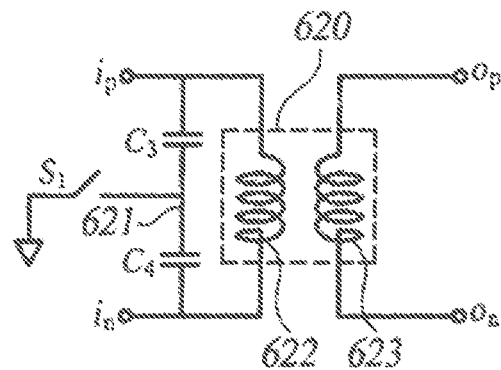
FIG. 6B shows a tunable impedance matching capacitor circuit in accordance with an embodiment.

FIG. 6B shows a tunable impedance matching capacitor circuit in accordance with an embodiment. FIG. 6B is a matching circuit capable of tuning an impedance and applicable to at least one of the input matching circuit 210, the intermediate matching circuit 230, and the output matching circuit 250. The tunable impedance matching capacitor circuit in FIG. 6B includes a transformer 620, two capacitors C3 and C4, and a switch S1. The capacitors C3 and C4 are connected in series and substitute for the capacitor C1 which is connected in parallel with a primary coil in FIG. 6A. The switch S1 is connected to ground, disposed at an intermediate node 621 between the capacitor C3 and the capacitor C4, and utilized for tuning an effective capacitance value of a primary coil 622. In FIG. 6B, a single-ended amplifier connected to the primary coil 622 or a secondary coil 623 can match a proper impedance, and an amplitude of a voltage level at the intermediate node 621 is low, so that the switch S1 connected to the capacitors can be designed easily. Furthermore, a quality factor of the matching circuit in FIG. 6B can have high performance. As a result, the matching circuit in FIG. 6B can be applicable to a power amplifier sensitive to loss of an impedance matching circuit.

Figure 6C:
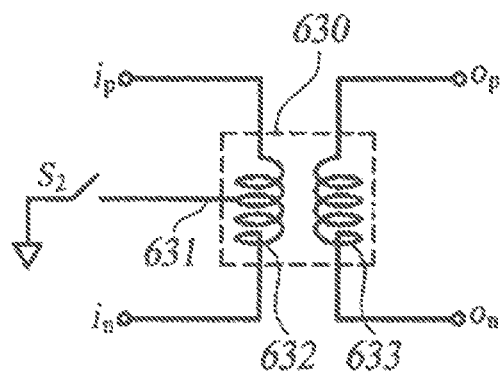
FIG. 6C shows a tunable impedance matching transformer circuit in accordance with an embodiment.

FIG. 6C shows a tunable impedance matching transformer circuit in accordance with an embodiment. FIG. 6C is a matching circuit capable of tuning an impedance and applicable to at least one of the input matching circuit 210, the intermediate matching circuit 230, and the output matching circuit 250. FIG. 6C, which is the same as FIG. 6B, has a switch S2 connected to ground and disposed at a transformer 630 or an intermediate tap node 631 of a primary coil 632 (a balanced/unbalanced converter). The switch S2 can tune an effective inductance value of the primary coil 632.

According to the power amplifiers in the embodiments of the present invention, the bias circuit part can be converted to decrease power consumption. Different from the prior art, performance of the present invention is not reduced in the high power mode, and no additional passive components like inductors or transformers with a large area are necessary to be further added. Furthermore, the tunable impedance matching circuit provides impedances respectively matching the impedances of the fully differential amplifier and the single-ended amplifier, thereby improving the performance of the power amplifier.

The above description is merely the specific embodiments of the present disclosure, but the protection scope of the present disclosure is not limited thereto, any skilled who is familiar with this art could readily conceive variations or substitutions within the disclosed technical scope disclosed by the present disclosure, and these variations or substitutions shall be encompassed in the protection scope of the present disclosure. Thus, the protection scope of the present disclosure shall be subjected to the protection scope of the claims.

What is claimed is:

1. A power amplifier, comprising:
   a main power amplifier having two differential inputs and two differential outputs;
   an input matching circuit receiving an input signal from at least one input signal terminal and connected to at least one input terminal of the main power amplifier, so that an impedance of the at least one input signal terminal matches an impedance of the at least one input terminal of the main power amplifier;
   an output matching circuit connected between at least one output terminal of the main power amplifier and a load, so that an impedance of the load matches an impedance of the at least one output terminal of the main power amplifier; and
   a bias circuit part, according to a received control signal, generating a conversion signal for driving the main power amplifier to be switched to a fully differential amplifier or a single-ended amplifier.

2. The power amplifier of claim 1, wherein the main power amplifier is operated as the fully differential amplifier in a high power mode, and the main power amplifier is operated as the single-ended amplifier in a low power mode.

3. The power amplifier of claim 2, wherein when the main power amplifier is operated in the low power mode, the bias circuit part selectively operates only one of the two differential inputs and only one of the two differential outputs.

4. The power amplifier of claim 3, wherein in the low power mode, the bias circuit part selectively provides a bias source for only one of the two differential inputs.

5. The power amplifier of claim 3, wherein the main power amplifier comprises two pairs of cascode structure parts, each pair of the cascode structure parts comprises a main transistor and a stacked transistor, a current input terminal of the main transistor is connected to a current output terminal of the stacked transistor, and the two differential inputs are respectively connected to control terminals of the main transistors of the two pairs of cascode structure parts, in the low power mode, the bias circuit part selectively provides a bias source for only one of the two differential inputs.

6. The power amplifier of claim 2, wherein when the main power amplifier is operated as the single-ended amplifier in the low power mode, an impedance of at least one of the input matching circuit and the output matching circuit is tunable.

7. The power amplifier of claim 6, wherein at least one of the input matching circuit, and the output matching circuit comprises:
   a transformer having a turns ratio tap; and
   two capacitors respectively connected in parallel with a primary coil and a secondary of the transformer,
   wherein an impedance of the transformer is adjusted by tuning the turns ratio tap or changing capacitance values of the two capacitors.

8. The power amplifier of claim 6, wherein at least one of the input matching circuit and the output matching circuit comprises:
   a transformer;
   two capacitors connected in series and connected in parallel with a primary coil of the transformer; and
   a switch disposed between the two capacitors and connected to ground,
   wherein an impedance of the transformer is adjusted by turning on or off the switch.

9. The power amplifier of claim 1, wherein at least one of the input matching circuit and the output matching circuit comprises:
   a transformer; and
   a switch disposed at a primary coil of the transformer and connected to ground,
   wherein an impedance of the transformer is adjusted by turning on or off the switch.

10. The power amplifier of claim 2 wherein the main power amplifier comprises:
    a first power amplifier connected between the input matching circuit and an intermediate matching circuit for amplifying the input signal;
    the intermediate matching circuit connected between at least one output terminal of the first power amplifier and at least one input terminal of a second power amplifier, so that an impedance of the at least one output terminal of the first power amplifier matches an impedance of the at least one input terminal of the second power amplifier; and
    the second power amplifier connected between the intermediate matching circuit and the output matching circuit for amplifying an output signal from the first power amplifier.

11. The power amplifier of claim 10, wherein the first power amplifier and the second power amplifier are operated as the fully differential amplifier in the high power mode, and the first power amplifier and the second power amplifier are operated as the single-ended amplifier in the low power mode.

12. The power amplifier of claim 11, wherein each of the first power amplifier and the second power amplifier comprises two differential inputs and two differential outputs, in the low power mode, the bias circuit part selects only one of the two differential inputs and only one of the differential outputs.

13. The power amplifier of claim 12, wherein in the low power mode, the bias circuit part selectively provides a bias source for only one of the two differential inputs.

14. The power amplifier of claim 12, wherein each of the first power amplifier and the second power amplifier comprises two pairs of cascode structure parts, each pair of the cascode structure parts comprises a main transistor and a stacked transistor, a current input terminal of the main transistor is connected to a current output terminal of the stacked transistor, and the two differential inputs are respectively connected to control terminals of the main transistors of the two pairs of cascode structure parts,
in the low power mode, the bias circuit part selectively provides a bias source for only one of the two differential inputs.

15. The power amplifier of claim 10, wherein when the main power amplifier is operated as the single-ended amplifier, an impedance of at least one of the input matching circuit and the output matching circuit is tunable.

16. The power amplifier of claim 15, wherein at least one of the input matching circuit and the output matching circuit comprises:
a transformer having a turns ratio tap; and
two capacitors respectively connected in parallel with a primary coil and a secondary of the transformer,
wherein an impedance of the transformer is adjusted by tuning the turns ratio tap or changing capacitance values of the two capacitors.

17. The power amplifier of claim 15, wherein at least one of the input matching circuit and the output matching circuit comprises:
a transformer;
two capacitors connected in series and connected in parallel with a primary coil of the transformer; and
a switch disposed between the two capacitors and connected to ground,
wherein an impedance of the transformer is adjusted by turning on or off the switch.

18. The power amplifier of claim 15, wherein at least one of the input matching circuit and the output matching circuit comprises:
a transformer; and
a switch disposed at a primary coil of the transformer and connected to ground,
wherein an impedance of the transformer is adjusted by turning on or off the switch.

* * * * *